(12) United States Patent
Iwakiri (10) Patent No.: US 7,800,218 B2
(45) Date of Patent: Sep. 21, 2010

(54) PACKAGE UNIT

(75) Inventor: Yoshihisa Iwakiri, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 11 days.

(21) Appl. No.: 11/889,079

(22) Filed: Aug. 9, 2007

(65) Prior Publication Data

US 2008/0036074 A1    Feb. 14, 2008

Related U.S. Application Data (63) Continuation of application No. PCT/JP2005/002277, filed on Feb. 15, 2005.

(51) Int. Cl.
*H01L 23/10*    (2006.01)
*H01L 23/34*    (2006.01)

(52) U.S. Cl. .......................... 257/706; 257/713

(58) Field of Classification Search ............... 257/706, 257/712, 713, E23.051
See application file for complete search history.

(56) References Cited

U.S. PATENT DOCUMENTS

| | | | |
|---|---|---|---|
| 5,703,398 A * | 12/1997 | Sono et al. ................... | 257/706 |
| 6,229,702 B1 * | 5/2001 | Tao et al. ..................... | 361/704 |
| 7,428,154 B2 | 9/2008 | Ishimine et al. | |
| 2001/0002729 A1 * | 6/2001 | Wong et al. .................. | 257/706 |
| 2004/0084764 A1 | 5/2004 | Ishimine et al. | |

FOREIGN PATENT DOCUMENTS

| JP | 3-178154 | 8/1991 |
|---|---|---|
| JP | 4-85861 | 3/1992 |
| JP | 2000-332169 | 11/2000 |
| JP | 2001-168562 | 6/2001 |
| JP | 2002-190560 | 7/2002 |
| JP | 2004-165586 | 6/2004 |

OTHER PUBLICATIONS

Japanese Notification of Reasons for Refusal, dated Jun. 22, 2010 and issued in corresponding Japanese Patent Application No. 2007-503510, partial translation.
Partial English translation of communication from Japanese Office Action mailed Jun. 22, 2010 (3 pages).
Japanese Office Action mailed Jun. 22, 2010 (3 pages).

* cited by examiner

*Primary Examiner*—David A Zarneke
*Assistant Examiner*—Jenny L Wagner
(74) *Attorney, Agent, or Firm*—Kratz, Quintos & Hanson, LLP (57) ABSTRACT

This invention relates to a package unit including a semiconductor package that houses a semiconductor chip, and a heat sink attached thereto. A peripheral wall section that surrounds a thermal junction member is provided on a stiffener. More preferably, a tip end section of the peripheral wall section is allowed to fit into a slit provided on the heat sink. The peripheral wall section may be provided on a heat spreader instead. It is possible to prevent the thermal junction member from falling outside without incurring addition of new components or new occupancy of the area on a system substrate.

4 Claims, 11 Drawing Sheets

PACKAGE UNIT

This application is a continuation of international application PCT/JP05/002277 filed Feb. 15, 2005.

TECHNICAL FIELD

The present invention relates to a package unit formed by housing a semiconductor chip in a semiconductor package and further attaching a heat sink thereto.

BACKGROUND ART

Heat generation of a semiconductor chip is becoming extremely large along developments in achieving higher integration and higher speed of a semiconductor circuit mounted on a semiconductor chip in recent years, and there is a special configuration for increasing radiation by forming a package unit by attaching a large heat sink to a semiconductor package housing such a semiconductor chip.

Figure 1:
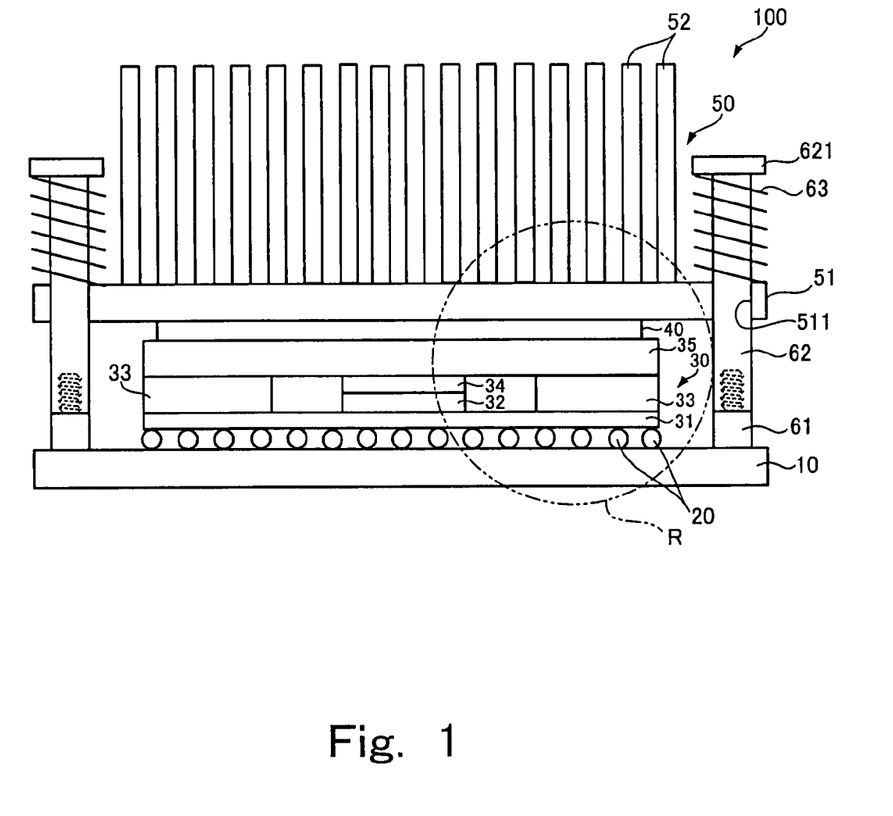
FIG. 1 is a schematic diagram of a conventional package unit.

FIG. 1 is a schematic diagram of a conventional package unit.

In a package unit 100 shown in FIG. 1, a semiconductor package 30 is mounted on a system substrate 10 by fusing and fixing solder balls 20.

This semiconductor package 30 includes a package substrate 31, a stiffener 33 which is made of stainless steel, copper or the like and is fixed to the package substrate 31 so as to surround a semiconductor chip 32 mounted in the center of the package substrate 31 as well as a peripheral portion of the package substrate 31 for preventing deformation such as warpage of the package substrate 31, and a heat spreader 35 which is typically made of copper and is fixed to the stiffener for receiving heat generated by the semiconductor chip 32 through a thermal junction member 34.

Furthermore, in the package unit 100 shown in FIG. 1, a thermal junction member 40 such as thermal grease or a thermal sheet is put on the heat spreader 35 of the semiconductor package 30, and a heat sink 50 composed of a base 51 and numerous fins 52 is further placed thereon.

A male screw member 61 including a male screw is fixed to the system substrate 10, and meanwhile, a mounting hole 511 for allowing penetration of a female screw member 62 including a female screw is formed on a base 51 of the heat sink 50. A shaft of the female screw member 62 is inserted into a coil spring 63 and the shaft of the female screw member 62 penetrates the mounting hole 511 of the base 51 of the heat sink 50, whereby the female screw of the female screw member 62 and the male screw of the male screw member 61 are screwed together. The coil spring 63 compresses in a space between a head 621 of the female screw member 62 and the base 51 of the heat sink 50 and pushes the heat sink 50 toward the semiconductor package 30, thereby enhancing adhesiveness between the semiconductor package 30 and the heat sink 50 while interposing the thermal junction member 40.

Figure 2:
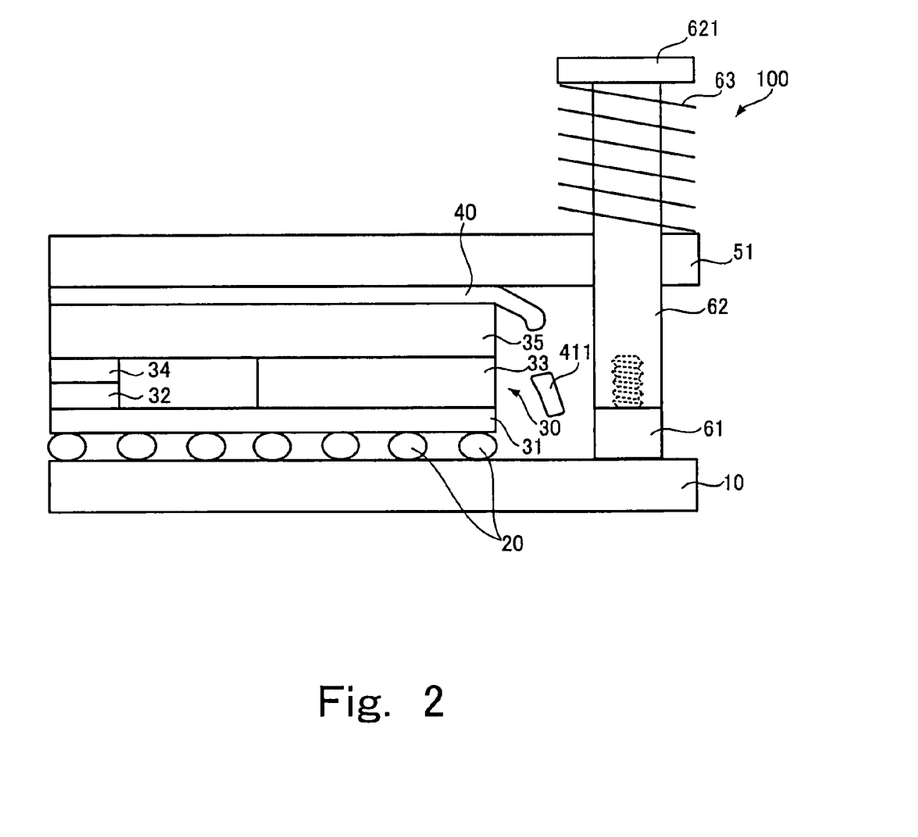
FIG. 2 is an enlarged view inside a circle R shown in FIG. 1.

FIG. 2 is an enlarged view inside a circle R illustrated in FIG. 1. It should be noted, however, that illustration of the fins 52 is omitted herein. A problem of the package unit 100 shown in FIG. 1 will be described with reference to FIG. 2.

When using the package unit 100 shown in FIG. 1 for a long time period, the thermal junction member 40 gradually reduces the thickness and expands sideways due to a thermal expansion difference between the semiconductor package 30 and the heat sink 50 caused by power-off of the semiconductor package, thermal distortion of the semiconductor package 30, and constant pressurization by the coil spring 63, whereby a fraction 411 of the thermal junction member 40 may break off and fall out of this package unit 100. Then, if this thermal junction member 40 has electric conductivity, the thermal junction member 40 may short-circuit other circuit components or wiring on the system substrate 10 which are not illustrated herein and thereby causing a malfunction or a failure. Alternatively, if this thermal junction member 40 has an electrical insulation property, the thermal junction member 40 may cause a contact failure when adding or replacing other circuit components onto the system substrate.

To avoid such a problem, Patent Documents 1 and 2 disclose ideas to dispose a thermal compound or grease which is one type of the thermal junction member inside a flange or in a space surrounded by an elastic member so as to prevent leakage of the thermal compound or grease to the outside.

Meanwhile, Patent Document 3 discloses an idea to dispose a spacer between a base corresponding to the system substrate shown in FIG. 1 and a heat sink in order to prevent application of excessive pressing force to a semiconductor chip and the like.

Patent Document 1: Japanese Unexamined Patent Application Publication No. Hei 4(1992)-85861
Patent Document 2: Japanese Patent Application Laid-Open Publication No. 2000-332169
Patent Document 3: Japanese Patent Application Laid-Open Publication No. 2001-168562

DISCLOSURE OF THE INVENTION

Although a certain level of an effect is expected from the technique for surrounding the thermal compound or grease by use of the flange or the elastic member as disclosed in Patent Documents 1 and 2 in light of reducing leakage of the thermal compound or grease to the outside, this technique requires a separate component such as the flange or elastic member and causes complication in assembly and a cost increase.

In addition, the technique disclosed in Patent Document 3 for preventing the heat sink from pressing the semiconductor chip and the like with an excessive force by disposing the spacer between the base and the heat sink has an uncertainty as to whether or not the spacer surrounds the entire periphery of the semiconductor chip and the like. Accordingly, it is uncertain whether or not leakage of the thermal junction member to the outside can be prevented. Moreover, when surrounding the entire periphery with this spacer, quite a large section of the area on the base (the system substrate) is occupied by the spacer, and a layout space for other circuit components is limited. Accordingly, there remains a problem from a viewpoint of high-density packaging of the circuit components on the base (the system substrate).

In view of the foregoing problems, it is an object of the present invention to provide a package unit for preventing a thermal junction from falling outside without incurring addition of new components or new occupancy of the area on a system substrate.

To attain the object, a package unit according to the present invention includes a semiconductor package that houses a semiconductor chip and is mounted on a system substrate, and a heat sink disposed in such a manner that a thermal junction member is interposed between the heat sink and the semiconductor package. Here, the semiconductor package includes a peripheral wall section that surrounds the periphery of the thermal junction member.

Here, a first package unit out of the package units of the present invention includes: a semiconductor package having a package substrate, a semiconductor chip mounted in an approximately central portion on a top surface of the package substrate, a stiffener mounted on a peripheral portion on the top surface of the package substrate and configured to make a circuit of the peripheral portion, and a thermal diffusion plate disposed in such a position that the semiconductor chip and the stiffener are interposed between the thermal diffusion plate and the package substrate, the semiconductor package being mounted on a system substrate while directing a back surface of the package substrate toward the system substrate; and a heat sink disposed in such a manner that a thermal junction member is interposed between the heat sink and the thermal diffusion plate. Here, the stiffener includes a peripheral wall section that surrounds the periphery of the thermal junction member.

Meanwhile, a second package unit out of the package units of the present invention includes: a semiconductor package having a package substrate, a semiconductor chip mounted in an approximately central portion on a top surface of the package substrate, a stiffener mounted on a peripheral portion on the top surface of the package substrate and configured to make a circuit of the peripheral portion, and a thermal diffusion plate disposed in such a position that the semiconductor chip and the stiffener are interposed between the thermal diffusion plate and the package substrate, the semiconductor package being mounted on a system substrate while directing a back surface of the package substrate toward the system substrate; and a heat sink disposed in such a manner that a thermal junction member is interposed between the heat sink and the thermal diffusion plate. Here, the thermal diffusion plate includes a peripheral wall section that surrounds the periphery of the thermal junction member.

In the package unit of the present invention, the stiffener or the thermal diffusion plate constituting the semiconductor package includes the peripheral wall section. Accordingly, it is possible to prevent the thermal junction member from falling or leaking outside. In this case, it is only necessary to modify the shape of the stiffener or the thermal diffusion plate, for example, and addition of new components is not required. Moreover, new occupancy of the area on the system substrate is avoided as well.

Here, in any case of the first and second package units of the present invention, it is preferable that the heat sink should include a groove into which a tip end of the peripheral wall section is fitted, the groove being located in a position corresponding to the tip end of the peripheral wall section.

In this way, it is easy to achieve accurate alignment when mounting the heat sink. Further, the thermal junction member is more reliably prevented from falling outside.

Meanwhile, it is also a preferable aspect that the stiffener in the first package unit of the present invention or the thermal diffusion plate in the second package unit of the present invention should include a supporting section that supports the heat sink.

By employing this configuration, the supporting section supports the heat sink, and an excessive load onto the semiconductor chip by the heat sink is prevented. Moreover, by fixing the supporting section to the heat sink by adhesion or the like, it is also possible to omit a screwing mechanism using a screw member.

As described above, according to the present invention, it is possible to prevent a thermal junction member from falling outside without incurring addition of a new component or new occupancy of the area on a system substrate.

BRIEF DESCRIPTION OF THE DRAWINGS

FIG. 4(A) is a plan view, and FIG. 4(B) is a front view of a stiffener constituting a semiconductor package of the package unit shown in FIG. 3.

BEST MODES FOR CARRYING OUT THE INVENTION

Now, embodiments of the present invention will be described below.

In the embodiments described below, in order to facilitate understandings, constituents identical to the constituents of the conventional package unit shown in FIG. 1 are designated by identical reference characters, irrespective of some differences in the shape. Hereafter, features of embodiments according to the present invention that are different from the conventional package unit of FIG. 1 will be explained.

Figure 3:
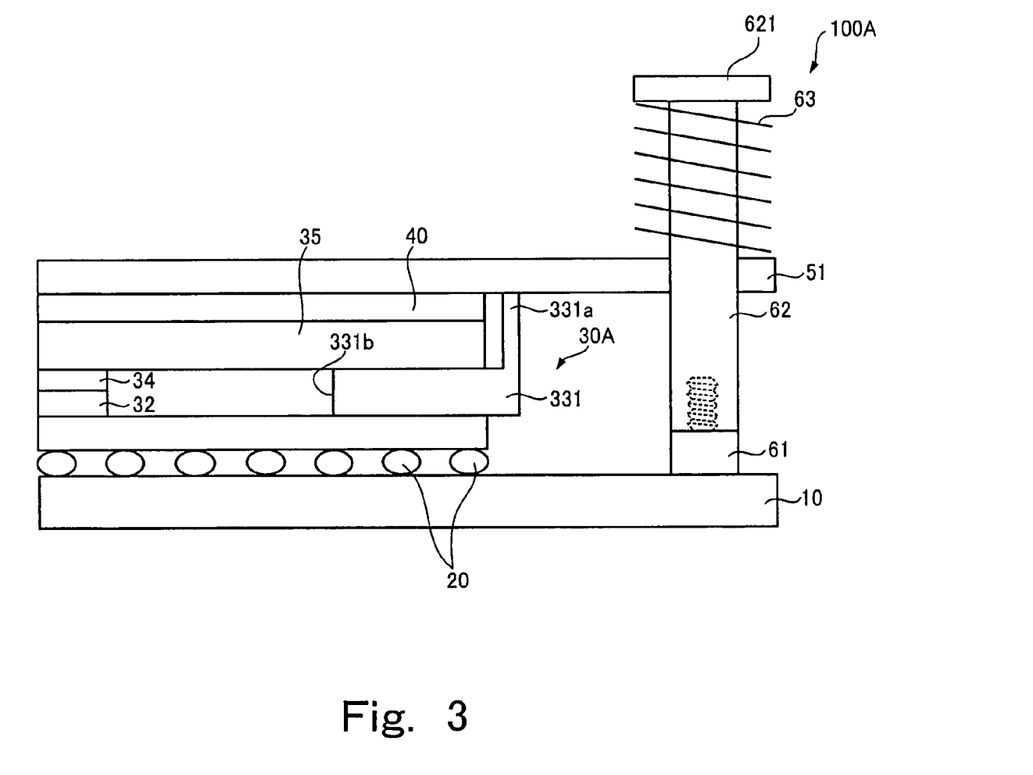
FIG. 3 is an enlarged view of a package unit according to a first embodiment of the present invention, which shows a portion corresponding to the circle R in FIG. 1.

FIG. 3 is an enlarged view of a package unit according to a first embodiment of the present invention, which shows a portion corresponding to the circle R in FIG. 1.

Instead of the stiffener 33 of the semiconductor package 30 constituting the conventional package unit 100 shown in FIG. 2, a stiffener 331 of a semiconductor package 30A has a peripheral wall section 331a that extends to a position substantially abutting on a base 51 of a heat sink.

Figure 4:
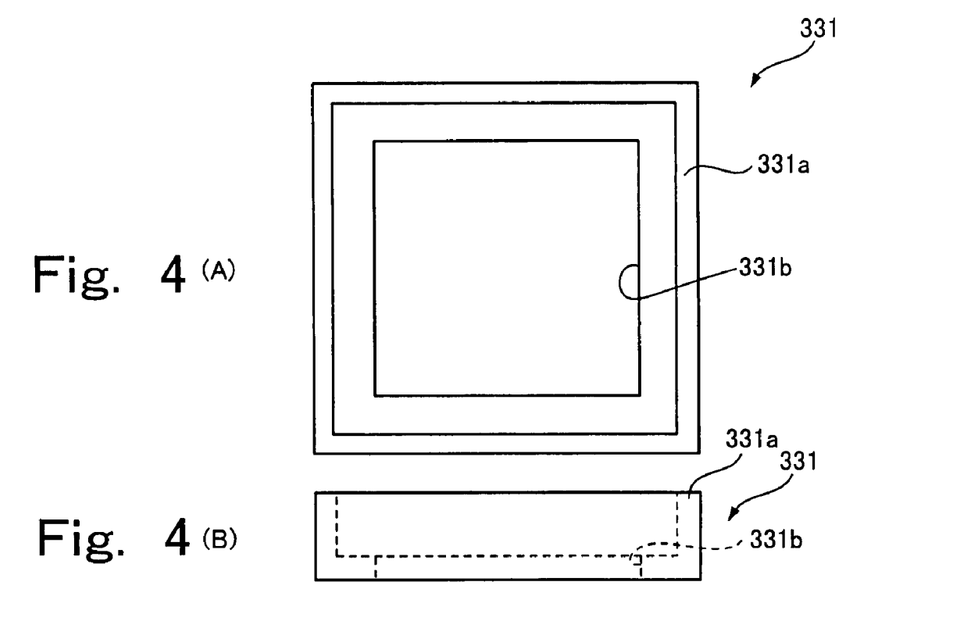

FIG. 4(A) is a plan view and FIG. 4(B) is a front view of the stiffener 331 constituting the semiconductor package 30A of a package unit 100A shown in FIG. 3.

The peripheral wall section 331a of this stiffener 331 is formed so as to surround the periphery of a thermal junction member 40 shown in FIG. 3, and an aperture 331b for mounting a semiconductor chip 32 (see FIG. 1) on a package substrate 31 is formed in the center thereof.

According to the package unit 100A shown in FIG. 3, since the stiffener 331 includes the peripheral wall section 331a, it is possible to prevent the thermal junction member 40 from falling outside the package unit 10A.

Figure 5:
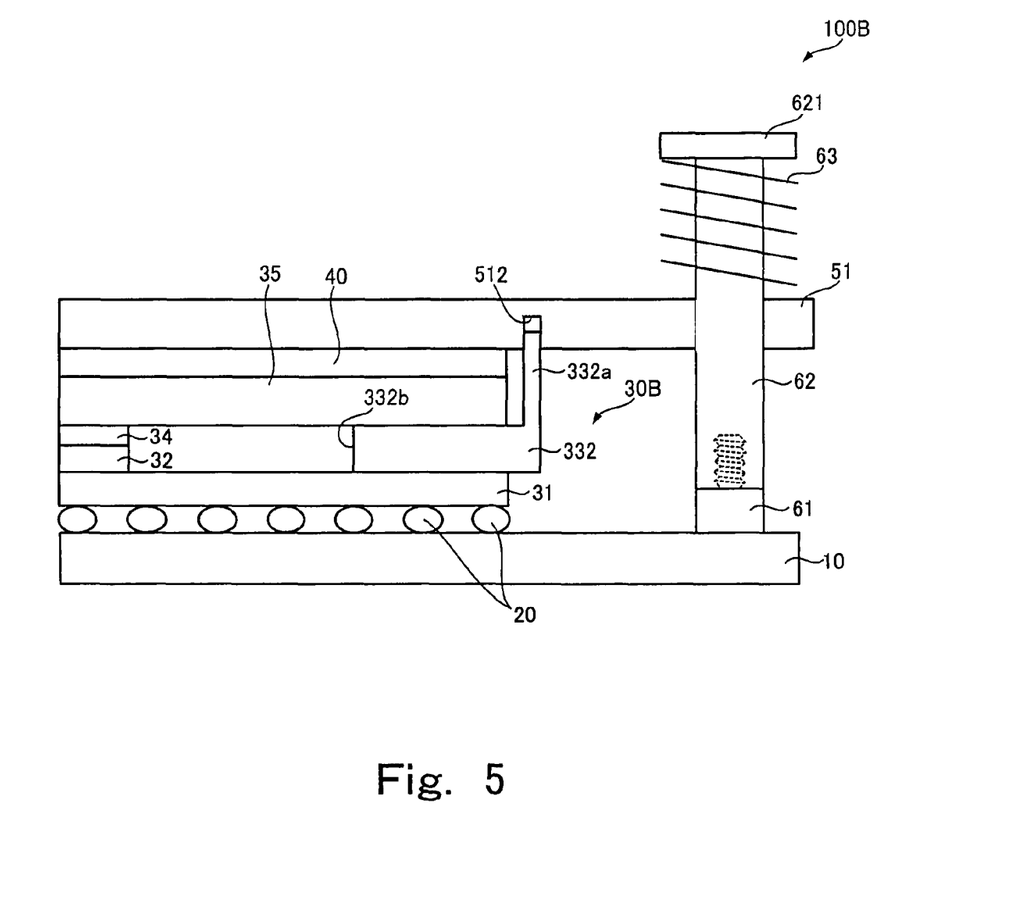
FIG. 5 is an enlarged view of a package unit according to a second embodiment of the present invention, which shows a portion corresponding to the circle R in FIG. 1.

FIG. 5 is an enlarged view of a package unit according to a second embodiment of the present invention, which shows a portion corresponding to the circle R in FIG. 1.

What is different from the conventional example shown in FIG. 2 is that a package unit 100B shown in this FIG. 5 includes a stiffener 332 of a semiconductor package 30B instead of the stiffener 33 of the semiconductor package 30 constituting the package unit 100 shown in FIG. 2, which has a peripheral wall section 332a that extends to a position intruding into a groove 512 provided on a base 51 of a heat sink.

Figure 6A:
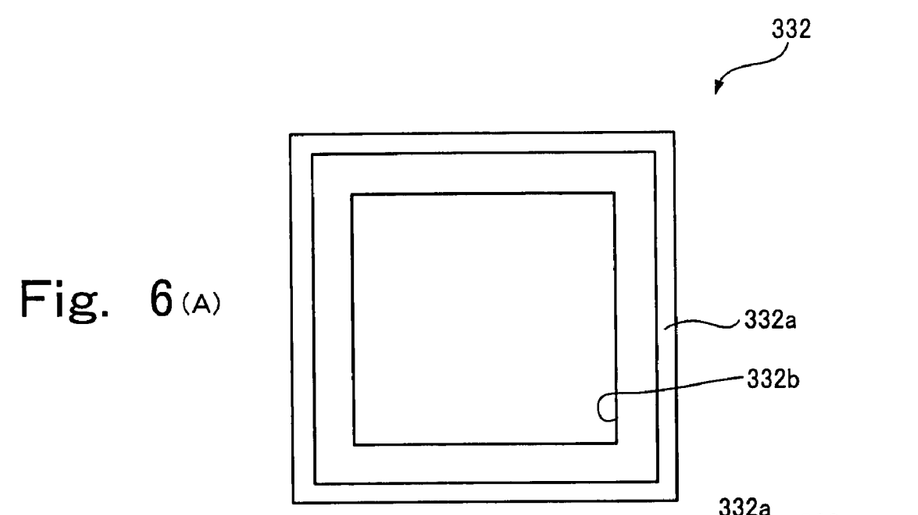
FIG. 6(A) is a plan view and FIG. 6(B) is a front view of a stiffener constituting a semiconductor package of the package unit shown in FIG. 5.
Figure 6B:
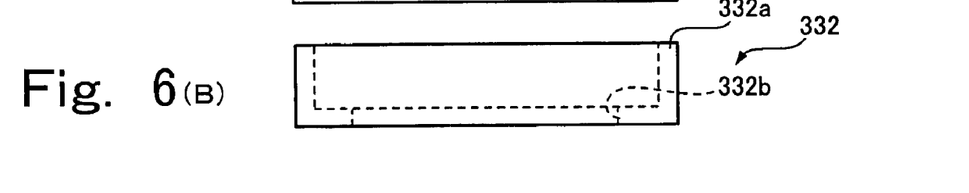

FIG. 6(A) is a plan view and FIG. 6(B) is a front view of the stiffener 332 constituting the semiconductor package 30B of the package unit 100B shown in FIG. 5.

As similar to the peripheral wall section 331a of the stiffener 331 constituting the first embodiment shown in FIGS. 4(A) and 4(B), the peripheral wall section 332a of this stiffener 332 is formed so as to surround the periphery of a thermal junction member 40 shown in FIG. 5, and an aperture 332b for mounting a semiconductor chip 32 on the package substrate 31 is formed in the center thereof. It should be noted, however, that the stiffener 332 shown in these FIGS. 6(A) and 6(B) has the peripheral wall section 332a that extends to a level so as to fit into the groove 512 (see FIG. 5) of the base 51 of the heat sink unlike the stiffener 331 shown in FIGS. 4(A) and 4(B).

In response thereto, the groove 512 formed on the base 51 of the heat sink is a groove that makes a rectangular circuit so as to allow the peripheral wall section 332a to fit into the entire periphery.

According to the package unit 100B of the second embodiment shown in FIG. 5 to FIG. 6(B), it is possible to achieve accurate alignment easily when assembling the heat sink because the peripheral wall section 332a of the stiffener 332 extends to the level to fit into the groove 512 provided on the base 51 of the heat sink. Moreover, as the peripheral wall section 332a fits into the groove 512, the thermal junction member 40 is more reliably prevented from falling outside this package unit 100B.

Figure 7:
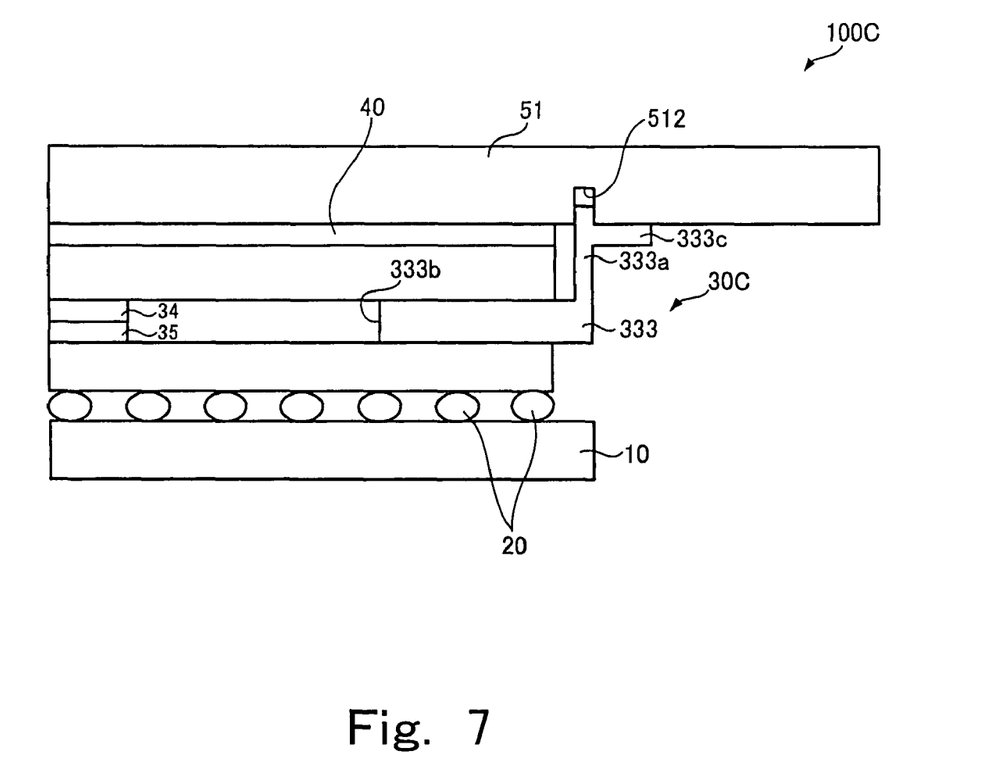
FIG. 7 is an enlarged view of a package unit according to a third embodiment of the present invention, which shows a portion corresponding to the circle R in FIG. 1.

FIG. 7 is an enlarged view of a package unit according to a third embodiment of the present invention, which shows a portion corresponding to the circle R in FIG. 1.

What is different from the conventional example shown in FIG. 2 is that a package unit 100C shown in FIG. 7 includes a stiffener 333 of a semiconductor package 30C instead of the stiffener 33 of the semiconductor package 30 constituting the package unit 100 shown in FIG. 2, which has a peripheral wall section 333a that extends to a position intruding into the groove 512 provided on the base 51 of a heat sink and a supporting section 333c that supports a lower surface of the base 51 of the heat sink. This supporting section 333c is attached to the lower surface of the base 51, whereby a screwing mechanism composed of the male screw member 61 and the female screw member 62 as shown in the package unit 100 of the conventional example in FIG. 1 becomes unnecessary.

Figures 8A, 8B:
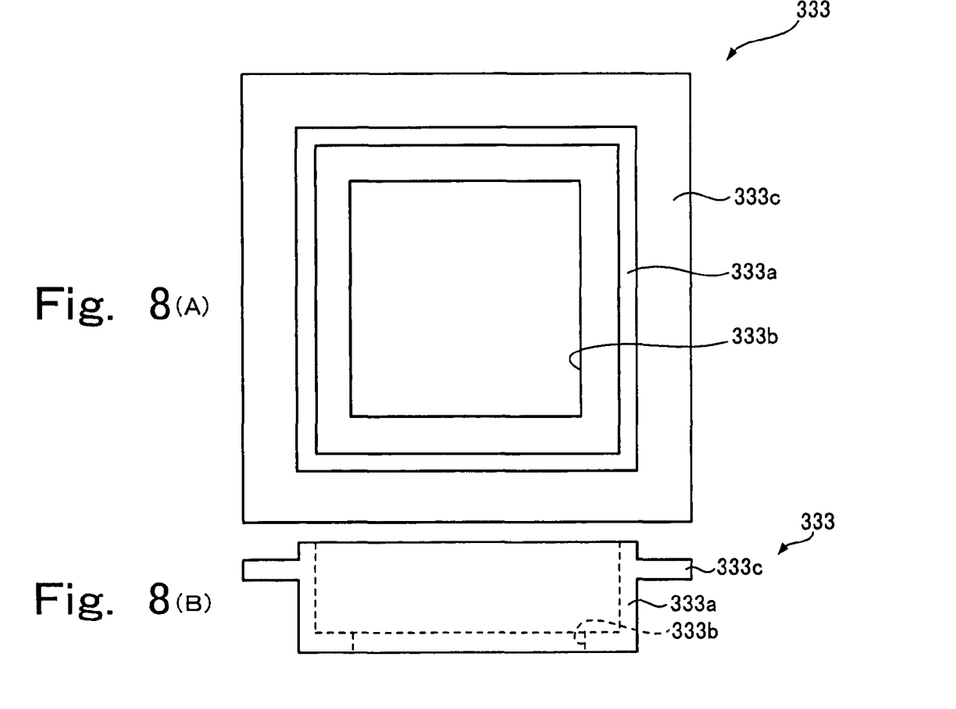
FIG. 8(A) is a plan view and FIG. 8(B) is a front view of a stiffener constituting a semiconductor package of the package unit shown in FIG. 7.

FIG. 8(A) is a plan view and FIG. 8(B) is a front view of the stiffener 333 constituting the semiconductor package 30C of the package unit 100C shown in FIG. 7.

As similar to the peripheral wall section 332a of the stiffener 332 constituting the second embodiment shown in FIGS. 6(A) and 6(B), the peripheral wall section 333a of this stiffener 333 is formed so as to surround the periphery of the thermal junction member 40 shown in FIG. 7, and an aperture 333b for mounting the semiconductor chip 32 on the package substrate 31 is formed in the center thereof. In addition, the stiffener 333 shown in these FIGS. 8(A) and 8(B) has the peripheral wall section 333a that extends to a level so as to fit into the groove 512 (see FIG. 5) of the base 51 of the heat sink similarly to the stiffener 332 shown in FIGS. 6(A) and 6(B).

The groove 512 formed on the base 51 of the heat sink is a groove that makes a rectangular circuit so as to allow the peripheral wall section 333a to fit into the entire periphery.

For this reason, according to the package unit 100C of the third embodiment shown in FIG. 7 to FIG. 8(B), it is possible to achieve accurate alignment easily when assembling the heat sink because the peripheral wall section 333a of the stiffener 333 extends to the level to fit into the groove 512 provided on the base 51 of the heat sink as similar to the package unit 100B of the second embodiment shown in FIG. 5 to FIG. 6(B). Moreover, as the peripheral wall section 332a fits into the groove 512, the thermal junction member 40 is more reliably prevented from falling outside this package unit 100C.

Furthermore, regarding the stiffener 333 shown in FIG. 7 to FIG. 8(B), the supporting section 333c is formed so as to spread horizontally outward from a position in the middle of the peripheral wall section 333a as shown in FIGS. 8(A) and 8(B), and is structured to support the base 51 of the heat sink by this supporting section 333c as shown in FIG. 7.

This supporting section 333c is attached to the composed of the male screw member 61 and the female screw member 62 as shown in the package unit 100 of the conventional example in FIG. 1 becomes unnecessary.

Figure 9:
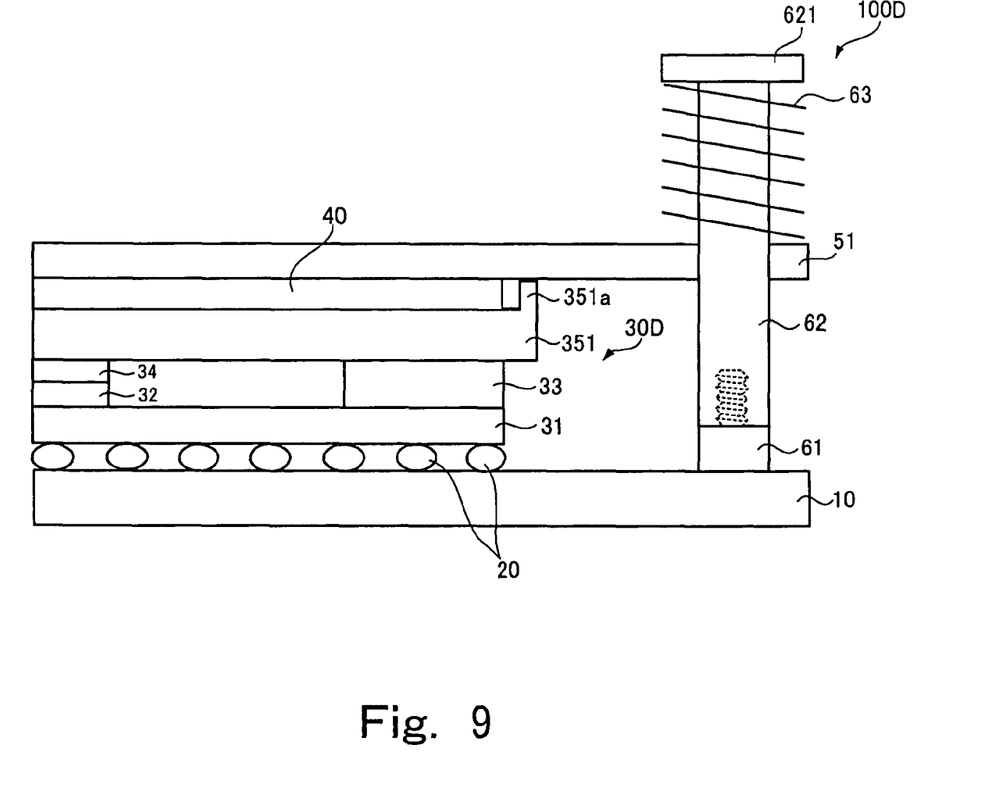
FIG. 9 is an enlarged view of a package unit according to a fourth embodiment of the present invention, which shows a portion corresponding to the circle R in FIG. 1.

FIG. 9 is an enlarged view of a package unit according to a fourth embodiment of the present invention, which shows a portion corresponding to the circle R in FIG. 1.

The peripheral wall section 331a is formed on the stiffener 331 in the case of the package unit 100A of the first embodiment shown in FIG. 3. In contrast, in the case of a package unit 100D of the fourth embodiment shown in this FIG. 9, a stiffer 33 has the same shape as the stiffener 33 of the conventional example shown in FIG. 1 and FIG. 2 while a peripheral wall section 351a is formed on a heat spreader 351 instead of the heat spreader 35 of the conventional example shown in FIG. 1 and FIG. 2. In this way, the package unit 100D of the fourth embodiment shown in this FIG. 9 is different from the package unit 100A of the first embodiment shown in FIG. 3 only in that the peripheral wall section 351a is formed on the heat spreader 351. Other constituents are identical to the package unit 100A of the first embodiment shown in FIG. 3. Moreover, the operation of the peripheral wall section 351a is identical to the operation of the peripheral wall section 331a formed on the stiffener 331 in the package unit 100A of the first embodiment shown in FIG. 3.

Figure 10:
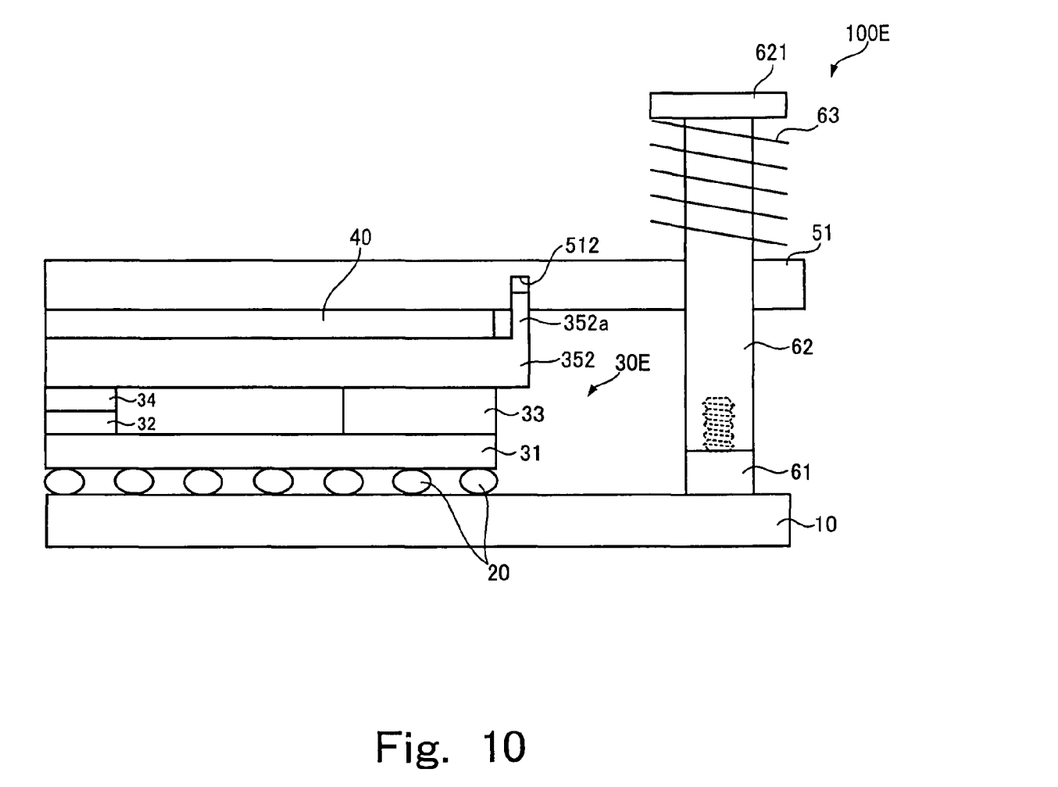
FIG. 10 is an enlarged view of a package unit according to a fifth embodiment of the present invention, which shows a portion corresponding to the circle R in FIG. 1.

FIG. 10 is an enlarged view of a package unit according to a fifth embodiment of the present invention, which shows a portion corresponding to the circle R in FIG. 1.

The peripheral wall section 332a having the level to fit into the groove 512 of the base 51 of the heat sink is formed on the stiffener 332 in the case of the package unit 100B of the second embodiment shown in FIG. 5. In contrast, in the case of a package unit 100E of the fifth embodiment shown in this FIG. 10, a stiffer 33 has the same shape as the stiffener 33 of the conventional example shown in FIG. 1 and FIG. 2 while a peripheral wall section 352a having the level to fit into the groove 512 of the base 51 of the heat sink is formed on a heat spreader 352 instead of the heat spreader 35 of the conventional example shown in FIG. 1 and FIG. 2. In this way, the package unit 100E of the fifth embodiment shown in this FIG. 10 is different from the package unit 100B of the second embodiment shown in FIG. 5 only in that the peripheral wall section 352a is formed on the heat spreader 352. Other constituents are identical to the package unit 100B of the second embodiment shown in FIG. 5. Moreover, the operation of the peripheral wall section 352a is identical to the operation of the peripheral wall section 332a formed on the stiffener 332 in the package unit 100B of the second embodiment shown in FIG. 5.

Figure 11:
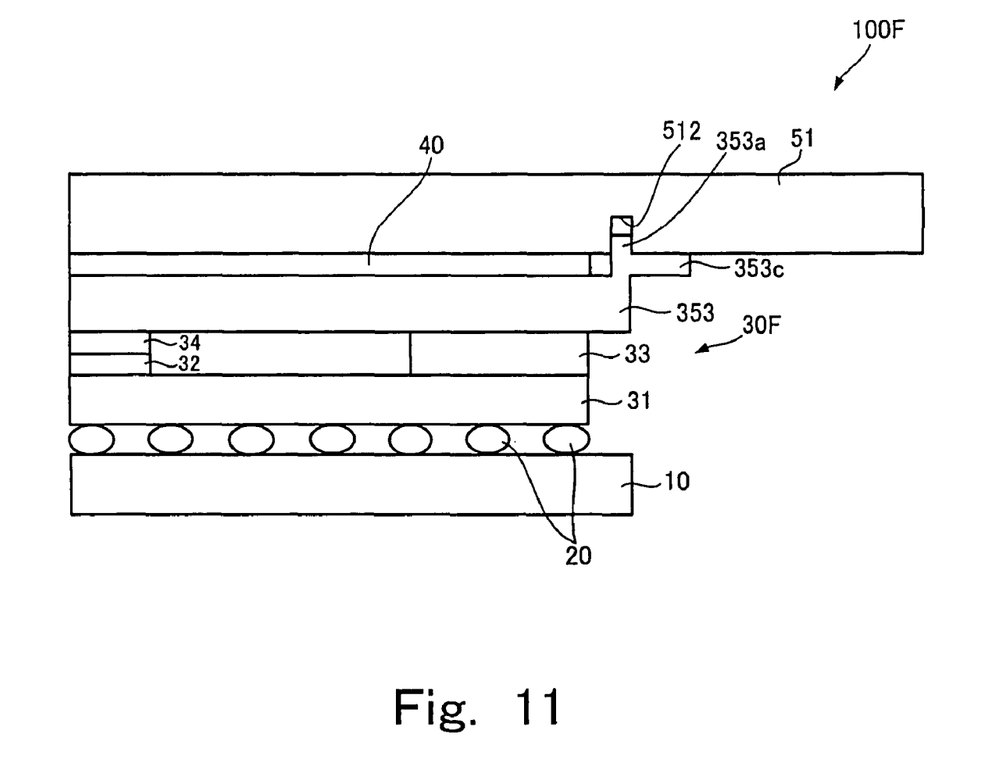
FIG. 11 is an enlarged view of a package unit according to a sixth embodiment of the present invention, which shows a portion corresponding to the circle R in FIG. 1.

FIG. 11 is an enlarged view of a package unit according to a sixth embodiment of the present invention, which shows a portion corresponding to the circle R in FIG. 1.

The peripheral wall section 333a and the supporting section 333c are formed on the stiffener 333 in the case of the package unit 100C of the third embodiment shown in FIG. 7. In contrast, in the case of a package unit 100F of the sixth embodiment shown in this FIG. 11, a stiffer 33 has the same shape as the stiffener 33 of the conventional example shown in FIG. 1 and FIG. 2 while a peripheral wall section 353a and a supporting section 353c are formed on a heat spreader 353 instead of the heat spreader 35 of the conventional example shown in FIG. 1 and FIG. 2. In this way, the package unit 100F of the sixth embodiment shown in this FIG. 11 is different from the package unit 100C of the third embodiment shown in FIG. 7 only in that the peripheral wall section 353a and the supporting section 353c are formed on the heat spreader 353. Other constituents are identical to the package unit 100C of the third embodiment shown in FIG. 7. Moreover, the operations of the peripheral wall section 353a and the supporting section 333c are identical to the operations of the peripheral wall section 333a and the supporting section 353c formed on the stiffener 333 in the package unit 100C of the third embodiment shown in FIG. 7.

The invention claimed is:

1. A package unit comprising:
   a semiconductor chip;
   a package substrate on which the semiconductor chip is mounted;
   a stiffener disposed around the semiconductor chip on the package substrate and configured to make a circuit of the semiconductor chip;
   a thermal diffusion plate disposed on the semiconductor chip and a portion of the stiffener;
   a thermal junction member disposed on the thermal diffusion plate; and
   a heat sink disposed on the thermal junction member,
   wherein the stiffener includes a peripheral wall section surrounding an entire periphery of the thermal junction member and the thermal diffusion plate by extending toward the heat sink, and
   wherein the heat sink includes a groove configured to make a circuit on a base of the heat sink so as to allow a tip end of the peripheral wall section to fit into an entire periphery of the groove, the groove being located in a position corresponding to the tip end of the peripheral wall section.

2. The package unit according to claim 1,
   wherein the tip end of the peripheral wall section of the stiffener extends upward to a level of the thermal junction member, and
   wherein the groove of the heat sink has a depth greater than the tip end of the peripheral wall portion.

3. A package unit comprising:
   a semiconductor chip;
   a package substrate on which the semiconductor chip is mounted;
   a stiffener disposed around the semiconductor chip on the package substrate and configured to make a circuit of the semiconductor chip;
   a thermal diffusion plate disposed on the semiconductor chip and the stiffener;
   a thermal junction member disposed on the thermal diffusion plate; and
   a heat sink disposed on the thermal junction member,
   wherein the thermal diffusion plate includes a peripheral wall section surrounding an entire periphery of the thermal junction member by extending toward the heat sink, and
   wherein the heat sink includes a groove configured to make circuit on a base of the heat sink so as to allow a tip end of the peripheral wall section to fit into an entire periphery of the groove, the groove being located in a position corresponding to the tip end of the peripheral wall section.

4. The package unit according to claim 3,
   wherein the tip end of the peripheral wall section of the thermal diffusion plate extends upward to a level of the thermal junction member, and
   wherein the groove of the heat sink has a depth greater than the tip end of the peripheral wall portion.

* * * * *